US008856556B2

(12) United States Patent
Tsuchiya (10) Patent No.: US 8,856,556 B2
(45) Date of Patent: Oct. 7, 2014

(54) SYSTEM AND METHOD FOR VERIFYING AND MAINTAINING CONSISTENCY BETWEEN AN INTENDED POWER MODE AND AN ACTUAL POWER MODE IN A SEMICONDUCTOR INTEGRATED CIRCUIT (75) Inventor: Takehiko Tsuchiya, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 976 days.

(21) Appl. No.: 12/706,952

(22) Filed: Feb. 17, 2010

(65) Prior Publication Data
US 2010/0295606 A1 Nov. 25, 2010

(30) Foreign Application Priority Data

May 19, 2009 (JP) ................................. 2009-121212

(51) Int. Cl.
G06F 1/00 (2006.01)
G06F 17/50 (2006.01)
(52) U.S. Cl.
CPC ................................. G06F 17/5045 (2013.01)
USPC ........................................................ 713/300
(58) Field of Classification Search
USPC .......................................... 713/300; 716/100
See application file for complete search history.

(56) References Cited

U.S. PATENT DOCUMENTS

| 7,770,142 | B1* | 8/2010 | Shmayovitsh et al. ........ 716/109 |
| 2007/0245278 | A1* | 10/2007 | Chen .................................. 716/5 |
| 2007/0245285 | A1* | 10/2007 | Wang et al. ..................... 716/10 |
| 2008/0071513 | A1* | 3/2008 | Chickermane et al. ......... 703/15 |
| 2008/0127015 | A1 | 5/2008 | Chandramouli et al. |
| 2009/0089725 | A1* | 4/2009 | Khan ................................. 716/5 |

* cited by examiner

Primary Examiner — Thomas Lee
Assistant Examiner — Xuxing Chen
(74) Attorney, Agent, or Firm — White & Case LLP (57) ABSTRACT A semiconductor integrated circuit design support system having a partial power control mechanism includes a partial power control simulation program configured to perform a partial power control simulation on the basis of a circuit description of the semiconductor integrated circuit and a power specifications description, a power mode transition detection program configured to detect a power mode which is run during execution of the partial power control simulation and record power mode information of an examined power mode, and a power mode transition check program configured to check whether the examined power mode recorded at the time of execution of partial power control is used and output a check result.

20 Claims, 9 Drawing Sheets

SYSTEM AND METHOD FOR VERIFYING AND MAINTAINING CONSISTENCY BETWEEN AN INTENDED POWER MODE AND AN ACTUAL POWER MODE IN A SEMICONDUCTOR INTEGRATED CIRCUIT

CROSS-REFERENCE TO RELATED APPLICATIONS

This application is based upon and claims the benefit of priority from the prior Japanese Patent Application No. 2009-121212 filed in Japan on May 19, 2009; the entire contents of which are incorporated herein by reference.

BACKGROUND OF THE INVENTION

1. Field of the Invention

The present invention relates to a semiconductor integrated circuit design support system, a design support method for a semiconductor integrated circuit, and a semiconductor integrated circuit and, more particularly, to a semiconductor integrated circuit design support system, a design support method for a semiconductor integrated circuit, and a semiconductor integrated circuit for performing partial power control by software.

2. Description of Related Art

Demand for less power consumption of semiconductor integrated circuits has recently increased. For the reason, a partial power-off technique for powering off an unused circuit section in a semiconductor integrated circuit while the circuit section is not used has been widely adopted in semiconductor integrated circuits.

Since the number of circuit sections, i.e., circuit ranges (hereinafter referred to as power domains) to be powered off and the number of combinations of power domains to be powered off were small in the past, a power control section was designed to be realized by a logic circuit, verified, and implemented in a semiconductor integrated circuit.

However, implementation by a logic circuit suffers from a problem of an inability to respond to different demands for low power consumption, due to an increase in a scale of semiconductor integrated circuits and diversification of demands for low power consumption in recent years. A software power control system in which power control is performed by software using an embedded microprocessor is being introduced for power control instead of a system using a logic circuit, as disclosed in, e.g., U.S. Patent No. 2008/0127015A1 or Hiroshi Nakamura, "Innovative Power Control for Ultra Low-Power and High-Performance System LSIs," Japan Science and Technology Agency, September 2008, retrieved from the Internet on May 18, 2009.

Even in the case of a power control system using software, the number of power modes for power control (i.e., the number of combinations of on/off statuses of a plurality of power domains) may be enormous. As for the number of power modes, since there are combinations, the number of which is 2 to the power of the number of power domains. For example, if the number of power domains is 20, the number of combinations is 1,048,576. For the reason, it is physically extremely difficult to thoroughly verify operation of a semiconductor integrated circuit for each of all combinations.

However, verification of a power mode in a semiconductor integrated circuit only within a range originally required by a user causes the following problem. If a power mode actually used in the semiconductor integrated circuit is changed, and a power mode outside the originally required range is run, since the power mode falls outside the originally required range and has not been verified, a malfunction may occur in the semiconductor integrated circuit.

That is, if there is inconsistency between an originally intended power mode and an actual power mode, a problem such as a malfunction in a semiconductor integrated circuit may occur due to insufficient verification.

BRIEF SUMMARY OF THE INVENTION

According to one aspect of the present invention, there can be provided a semiconductor integrated circuit design support system having a partial power control mechanism, including a partial power control simulation section configured to perform a partial power control simulation on the basis of a circuit description of the semiconductor integrated circuit and a power specifications description, a power mode detection section configured to detect a power mode which is run during execution of the partial power control simulation and record power mode information of an examined power mode, and a power mode check section configured to check whether the examined power mode recorded by the power mode detection section at the time of execution of partial power control is used and output a check result.

According to one aspect of the present invention, there can be provided a semiconductor integrated circuit having a partial power control mechanism, including a storage section capable of storing power mode information of an examined power mode in the semiconductor integrated circuit, and a power mode check section configured to check whether the examined power mode stored at the time of execution of partial power control is used and, if a power mode other than the examined power mode checked is run, output a predetermined interrupt signal to a CPU of the semiconductor integrated circuit.

According to one aspect of the present invention, there can be provided a semiconductor integrated circuit having a partial power control mechanism, including a storage section capable of storing power mode information of an examined power mode in the semiconductor integrated circuit, and a power mode check section configured to check whether the examined power mode stored at the time of execution of partial power control is used and, when a power mode other than the examined power mode checked is run, replace the power mode other than the examined power mode with the examined power mode and run the examined power mode.

According to one aspect of the present invention, there can be provided a design support method for a semiconductor integrated circuit having a partial power control mechanism, including performing a partial power control simulation on the basis of a circuit description of the semiconductor integrated circuit and a power specifications description, detecting a power mode which is run during execution of the partial power control simulation and recording power mode infatuation of an examined power mode, and checking whether the examined power mode recorded at the time of execution of partial power control is used and outputting a check result.

DETAILED DESCRIPTION OF THE INVENTION

Embodiments of the present invention will be described below with reference to the drawings.

First Embodiment

System Configuration

Figure 1:
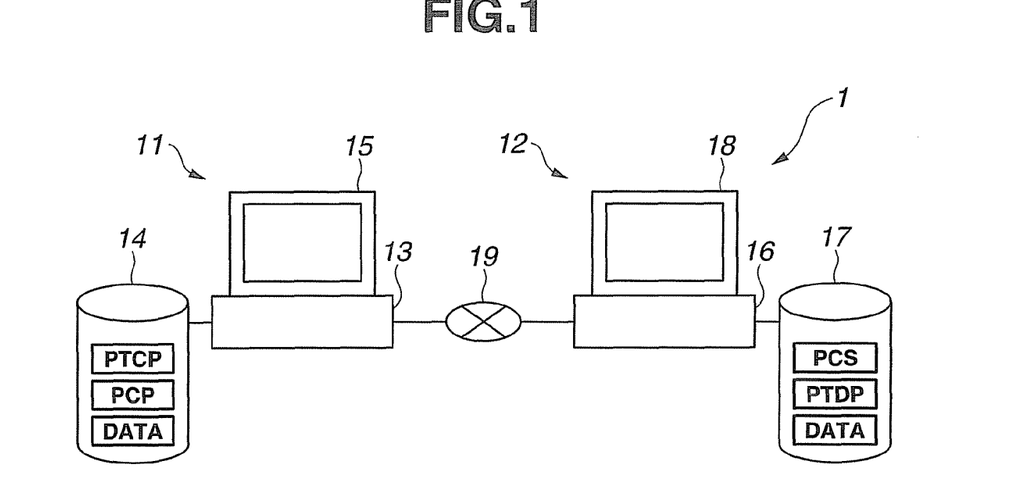
FIG. 1 is a configuration diagram showing a configuration of a semiconductor integrated circuit design support system according to a first embodiment of the present invention.

FIG. 1 is a configuration diagram showing a configuration of a semiconductor integrated circuit design support system according to a first embodiment of the present invention. The present embodiment is an example of a case where a semiconductor device manufacturer designs a semiconductor integrated circuit having a partial power control mechanism on the basis of power control specifications from a user of a semiconductor device, and the user manufactures a piece of equipment incorporating the designed semiconductor integrated circuit. In the case, the user, who is what is called an assembled product manufacturer, designs the piece of equipment such that the semiconductor integrated circuit operates in a power mode for predetermined partial power control. However, there may be an incompatibility between original power control specifications and a created power control program due to presentation of wrong specifications, changes to the specifications, or the like. A semiconductor integrated circuit design support system 1 according to the present embodiment is intended to resolve such an incompatibility. That is, the first embodiment is an example of a case where an incompatibility as described above is resolved if hardware as a semiconductor integrated circuit and software as a power control program are separately developed.

The semiconductor integrated circuit design support system 1 includes a system 11 on the user (assembled product manufacturer) side and a system 12 on the manufacturer (semiconductor integrated circuit manufacturer) side.

The system 11 is composed of a device main body 13 which is, for example, a personal computer (PC) and includes a central processing unit (CPU) and a main memory, a storage device 14 connected to the device main body 13 and configured to store various programs and data, and a monitor 15 connected to the device main body 13 and configured to display various information to a creator of a power control program. The system 12 is also composed of a device main body 16 which is, for example, a PC and includes a CPU and a main memory, a storage device 17 connected to the device main body 16 and configured to store various programs and data, and a monitor 18 connected to the device main body 16 and configured to display various information to a designer of a semiconductor integrated circuit.

The two systems 11 and 12 are connected to each other through a network 19 such as an Internet.

Note that although the semiconductor integrated circuit design support system (hereinafter sometimes simply referred to as the system) 1 is a system composed of two PCs in the present embodiment, the system 1 may be a client server system including terminal devices and a server device or any other form of system.

Also note that the two systems 11 and 12 may not be connected to each other by a network.

A power mode transition check program (PTCP), a power control program (PCP), and various data (DATA) are stored in the storage device 14 of the system 11 on the user side. A partial power control simulation program (PCS), a power mode transition detection program (PTDP), and the various data (DATA) are stored in the storage device 17 of the system 12 on the manufacturer side.

A semiconductor integrated circuit designer can perform design of a semiconductor integrated circuit, a simulation, and the like by operating the system 12. In the present embodiment, in particular, a simulation related to power control is performed, and power mode transition detection is performed.

The user performs a power mode transition check (to be described later) by executing the developed power control program (PCP) in the system 11.

(Configuration of Semiconductor Device)

Figure 2:
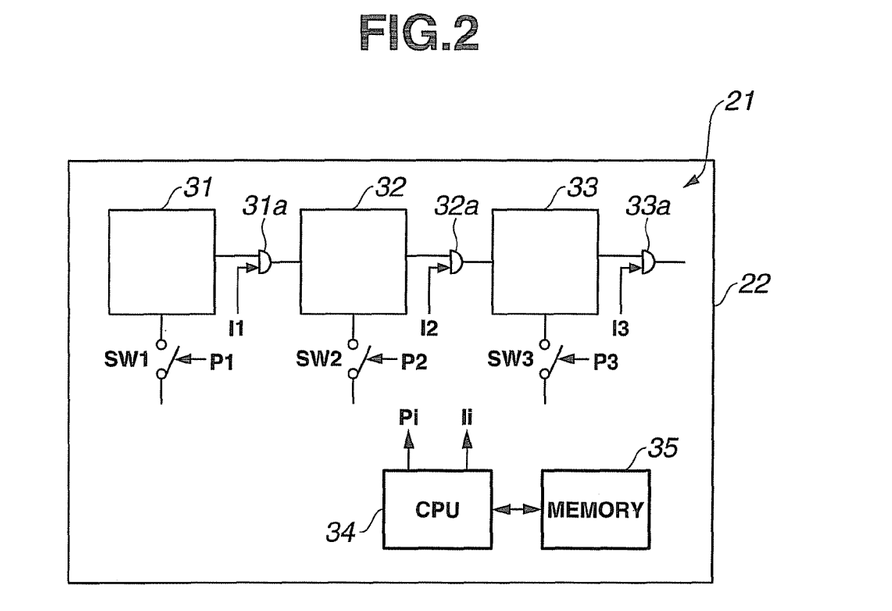
FIG. 2 is a diagram for explaining an example of a configuration of a semiconductor integrated circuit configured to perform partial power control according to the first embodiment of the present invention.

FIG. 2 is a diagram for explaining an example of a configuration of a semiconductor integrated circuit to be subjected to partial power control. A semiconductor integrated circuit 21 including various circuits for realizing a desired function is eventually formed on a semiconductor chip 22. The semiconductor integrated circuit 21 formed on the semiconductor chip 22 has a plurality of circuit sections and a plurality of partial power-off ranges, i.e., power domains.

FIG. 2 shows the semiconductor integrated circuit 21 having three power domains as circuit ranges, power supply to which can be stopped, for simplicity of illustration. The semiconductor integrated circuit 21 includes three power domains 31, 32, and 33, a CPU 34 as an embedded microprocessor, and a memory 35.

The power control program (PCP) is stored in the memory 35 of the semiconductor integrated circuit 21 on the semiconductor chip 22. The CPU 34 executes the power control program (PCP), thereby performing partial power control of the semiconductor integrated circuit 21. Partial power control is performed by the CPU 34 outputting a power control signal Pi (i=1 to 3) and an isolation signal Ii (i=1 to 3) to each power domain at a predetermined time.

Referring to FIG. 2, the power control signal P1 is inputted to the power domain 31, and an output signal from the power domain 31 is supplied to one input terminal of a logic circuit (an AND (logical product) circuit in the example) 31a. The isolation signal I1 is inputted to the other input terminal of the AND circuit 31a, and an output from the AND circuit 31a is supplied to the adjacent power domain 32. In the example, the power control signal P1 is a control signal to a switch SW1 connected to the power domain 31 and configured to control power supply.

Similarly, the power control signals P2 and P3 are inputted from the CPU 34 to switches SW2 and SW3 for the power domains 32 and 33, and output signals are supplied to one input terminals of AND circuits 32a and 33a. The isolation signals I2 and I3 are inputted to the other input terminals of the AND circuits 32a and 33a. An output from the AND circuit 32a is supplied to the adjacent power domain 33, and an output from the AND circuit 33a is supplied to a circuit (not shown).

Directions to output each of the power control signals and each of the isolation signals are given by writing predetermined data into a corresponding register on the semiconductor integrated circuit 21. Accordingly, the user can cause the semiconductor integrated circuit 21 to perform partial power control by including instructions to write predetermined data into a corresponding register in the power control program (PCP).

(Power Mode Transition Detection Process in Semiconductor Device Manufacturer)

A manufacturer which designs the semiconductor integrated circuit 21 in FIG. 2 simulates power control using simulation technologies at a stage of design of the semiconductor integrated circuit 21 having a partial power control mechanism. As a result, a power mode transition performed and verified in the simulation is detected.

Figure 3:
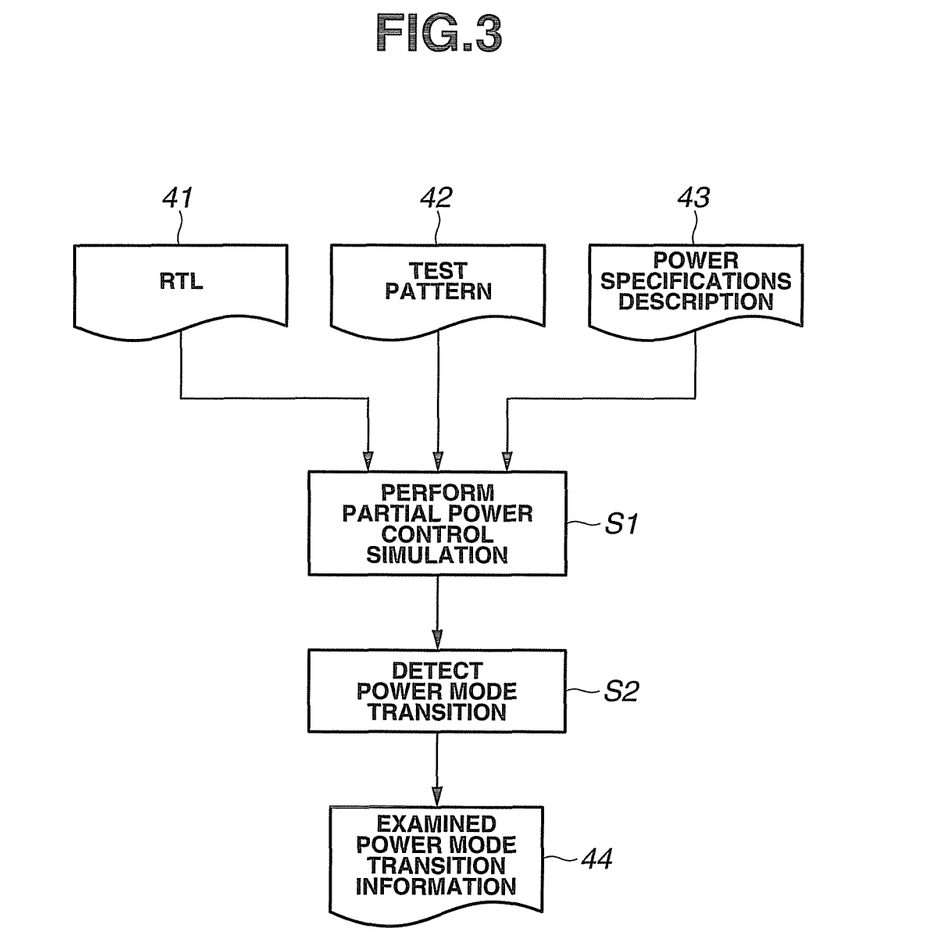
FIG. 3 is a flow chart for explaining a flow of a power mode transition detection process in a semiconductor device manufacturer, according to the first embodiment of the present invention.

FIG. 3 is a flow chart for explaining a flow of a power mode transition detection process in the semiconductor device manufacturer. The process in FIG. 3 is performed by the CPU of the device main body 16 executing the partial power control simulation program (PCS) and the power mode transition detection program (PTDP) stored in the storage device 17 in the system 12 on the manufacturer side.

As shown in FIG. 3, the partial power control simulation program (hereinafter sometimes simply referred to as the simulation program) (PCS) performs a partial power control simulation on the basis of an RTL description 41 which describes the configuration of the semiconductor integrated circuit 21, test pattern information 42, and a power specifications description 43 from the user (step S1). The RTL description 41, the test pattern information 42, and the power specifications description 43 from the user are stored as a part of the various data (DATA) in the storage device 17.

The test pattern information 42 includes test environment information. The power specifications description 43 is information on power control specifications from the user (assembled product manufacturer). In step S1, the simulation program (PCS) constituting a partial power control simulation section performs the partial power control simulation in accordance with the power control specifications expected by the user under a test environment expected by the user.

The simulation program (PCS) performs a simulation of a partial power control state using the RTL description 41, which is a circuit description of the semiconductor integrated circuit, the test pattern information 42, and the power specifications description 43 as inputs in order to verify validity of the power specifications, thereby performing a process of checking whether the semiconductor integrated circuit 21 operates as expected.

The power mode transition detection program (PTDP) serving as a power mode detection section monitors operation of the simulation program (PCS) and a processing result and detects a power mode transition (step S2).

As described above, partial power control is performed by writing predetermined data into a predetermined register on the semiconductor chip 22. In a simulation as well, partial power control is performed by writing predetermined data into a predetermined register. Instructions to set or change a power mode are also given at the time of a simulation, and the setting or change of the power mode can be detected by watching for writing of data into a predetermined register, as described above.

Accordingly, the power mode transition detection program (PTDP) serving as the power mode detection section monitors execution of the simulation program (PCS) and checks for writing of predetermined data into a predetermined register. In step S2, the power mode transition detection program (PTDP) generates information on each power mode in which the semiconductor integrated circuit 21 is confirmed to operate appropriately and outputs the information as examined power mode transition information 44 to the storage device 17. As described above, the power mode transition detection program (PTDP) detects power modes run during execution of the partial power control simulation and records power mode information of each examined power mode.

Changes in information on the detected power modes include information on a transition among the examined power modes during the execution of the partial power control simulation. More specifically, information on power modes which are outputted over time is information on examined power modes, and operation checks are performed while switching is performed among power modes over time. Accordingly, the information on the power modes also includes information on a transition among the power modes having undergone the operation checks. The examined power mode transition information 44 is supplied as file data to the user over the network 19 or through a separate storage medium.

Figure 4:
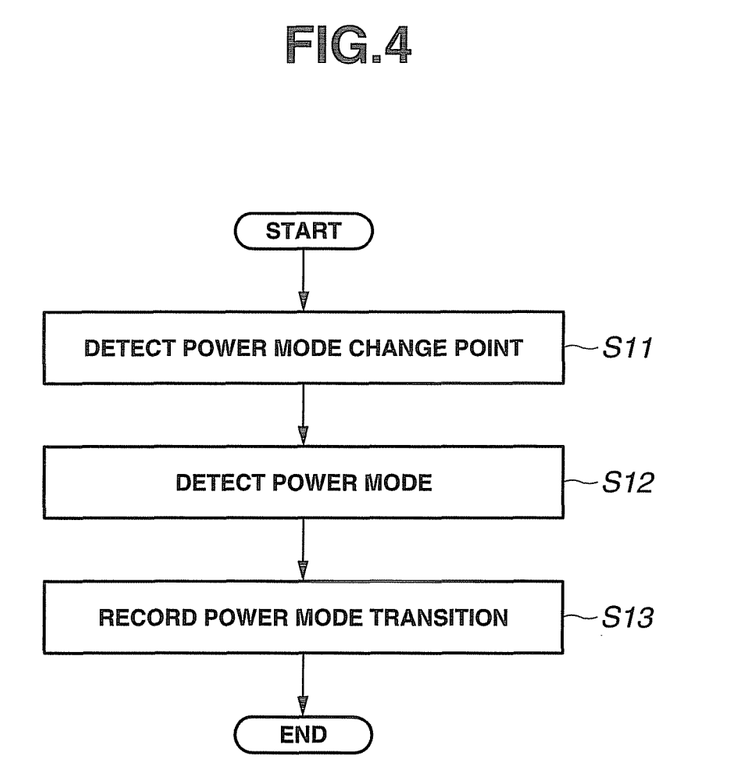
FIG. 4 is a flow chart showing an example of contents of a power mode transition detection program (PTDP) according to the first embodiment of the present invention.
Figure 5A:
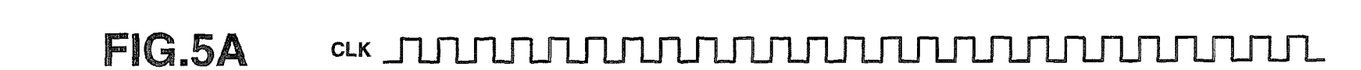
FIGS. 5A to 5H are waveform charts for explaining operation of the power mode transition detection program (PTDP) according to the first embodiment of the present invention.
Figure 5B:
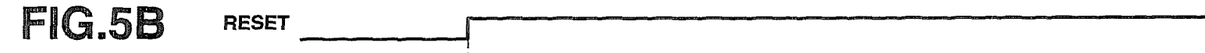
Figure 5C:
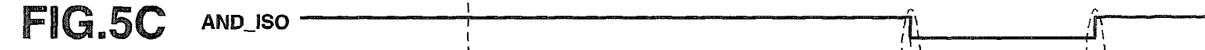
Figure 5D:
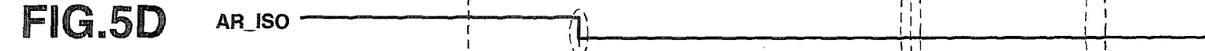
Figure 5E:
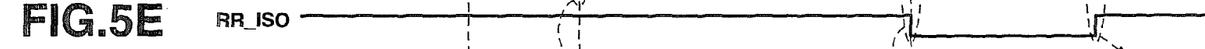
Figure 5F:
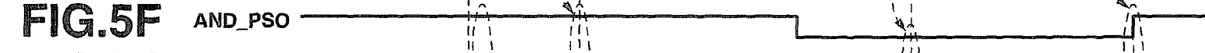
Figure 5G:
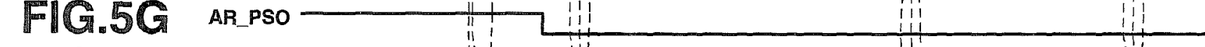
Figure 5H:
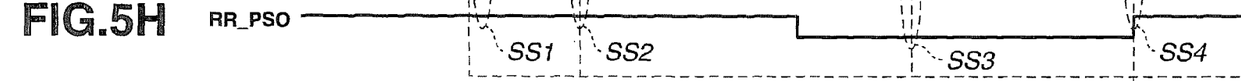

Details of processing of the power mode transition detection program (PTDP) will be described. FIG. 4 is a flow chart showing an example of contents of the power mode transition detection program (PTDP).

First, a power mode change point is detected (step S11). The power mode transition detection program (PTDP) observes all the isolation signals and detects, as a power mode change point, a time point when any of the isolation signals changes.

After the power mode change point is detected, a power mode is detected (step S12). At the time of the power mode detection, values of all the power control signals at a change point after the power mode change point are detected in the case of power-off, and values of all the power control signals at the power mode change point are detected in the case of a return from power-off. Accordingly, the power mode detection is performed on the basis of the isolation signals and the power control signals to each of the power domains during execution of the partial power control simulation.

After the power mode is detected, the power mode is recorded (step S13). The power mode detected in step S12, i.e., information on a combination of on/off statuses of the plurality of power domains is outputted to and stored in a predetermined storage area of the storage device 17.

Each time a power mode change point is detected, the power mode transition detection program (PTDP) performs the processes in steps S11 to S13.

The details of processing of the above-described power mode transition detection program (PTDP) will be described with reference to the drawings. FIGS. 5A to 5H are waveform charts for explaining operation of the power mode transition detection program (PTDP).

FIGS. 5A to 5H show waveforms associated with power control operation of the semiconductor integrated circuit 21 and show waveforms of a reset signal, the isolation signals, and the power control signals to the three power domains. The reset signal is a signal for resetting the semiconductor integrated circuit 21. Isolation signals AND_ISO, AR_ISO, and RR_ISO respectively correspond to the isolation signals I1, I2, and I3 to the power domains 31, 32, and 33. Power control signals AND_PSO, AR_PSO, and RR_PSO correspond to the power control signals P1, P2, and P3 to the power domains 31, 32, and 33. Note that FIGS. 5A to 5H show low-active operation.

A status of each signal is determined by contents of data written into a predetermined register in the simulation.

Referring to FIGS. 5A to 5H, the reset signal (RESET) changes to HIGH at time t1 with respect to a clock signal CLK. Immediately after reset, the statuses of the three power control signals (AND_PSO, AR_PSO, and RR_PSO) are each HIGH (i.e., "1") (i.e., power is off).

After that, at time t2, the isolation signal AR_ISO changes to LOW (i.e., "0"), a power mode change point is detected. Before the power mode change point, power to the corresponding power domain 32 is turned from off to on. Since the power domain 32 returns from power-off, i.e., is powered on, values of all the power control signals at time t2 at the power mode change point are recorded as a power mode.

A power mode is expressed in the form PM(status of AND_PSO, status of AR_PSO, status of RR_PSO). Immediately after the reset, initial statuses of the three power control signals (AND_PSO, AR_PSO, and RR_PSO) are as indicated by SS1, and a power mode is PM(1,1,1). At time t2, the power mode change point is detected. Although the initial power mode is PM(1,1,1), a power mode at time t2 is PM(1,0,1), as indicated by SS2, and is stored.

After a period of time, the isolation signals AND_ISO and RR_ISO change to LOW (i.e., "0"), and a power mode change point is detected. Before the power mode change point, power to each of the corresponding power domains 31 and 33 is turned from off to on. Since the power domains 31 and 33 return from power-off, i.e., are powered on, values of all the power control signals at time t3 at the power mode change point are recorded as a power mode. The power mode is PM(0,0,0), as indicated by SS3, and is stored.

After another period of time, the isolation signals AND_ISO and RR_ISO change to HIGH (i.e., "1"), and a power mode change point is detected. After the power mode change point, the power to each of the corresponding power domains 31 and 33 are turned from on to off. Since the power to each of the power domains 31 and 33 is turned off, i.e., the power domains 31 and 33 are powered off, values of all the power control signals after a power control signal change at time t4 at a change point for all the power control signals after the power mode change point are recorded as a power mode. The power mode is PM(1,0,1), as indicated by SS4, and is stored.

In the case of FIGS. 5A to 5H, the power modes stored in the storage device 17 are PM(1,1,1), PM(1,0,1), PM(0,0,0), and PM(1,0,1). An order in which the four power modes are recorded indicates a transition among the power modes over course of time, which means that the transition among the power modes is also stored in the storage device 17.

As described above, the power mode transition detection program (PTDP) outputs, as the examined power mode transition information 44, a transition between each two power modes and a power mode transition with up to a user-defined number (corresponding to the number of mode changes, three in FIGS. 5A to 5H) of stages, with regard to the detected power modes.

Information on the recorded power modes, i.e., the examined power mode transition information 44 is supplied as data to the user as the assembled product manufacturer via, for example, the network 19.

(Power Mode Transition Check Process in Assembled Product Manufacturer)

The user creates the power control program (PCP) for the semiconductor integrated circuit 21 to be incorporated in a developed piece of equipment. A power mode transition check is performed by the power mode transition check program (PTCP) serving as a power mode check section using the examined power mode transition information 44 from the manufacturer of the semiconductor integrated circuit 21 and the power control program (PCP).

Figure 6:
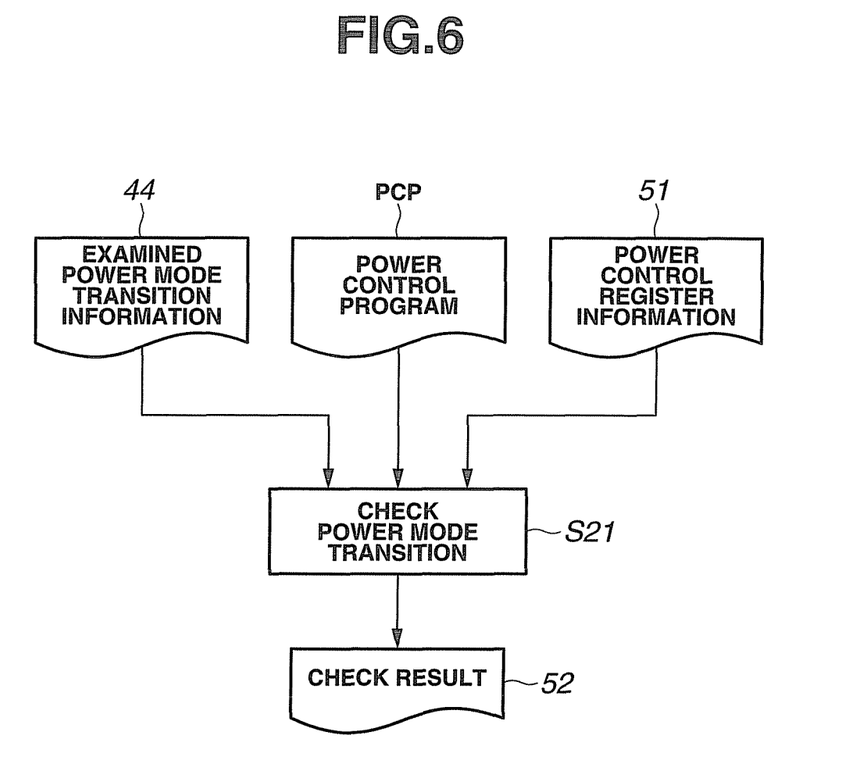
FIG. 6 is a flow chart for explaining a flow of a power mode transition check process in an assembled product manufacturer, according to the first embodiment of the present invention.

FIG. 6 is a flow chart for explaining a flow of a power mode transition check process in the assembled product manufacturer. The process in FIG. 6 is performed by the CPU of the device main body 13 executing the power mode transition detection program (PTDP) stored in the storage device 14, in the system 11 on the assembled product manufacturer side.

As shown in FIG. 6, the power mode transition check program (PTCP) performs a process of checking a power mode transition on the basis of the examined power mode transition information 44, power control register information 51, and the power control program (PCP) (step S21).

Note that since the power mode transition check program (PTCP) is composed of a software program, the power mode transition check program (PTCP) may be provided as a program for power control software inspection (i.e., a checker program) from the semiconductor device manufacturer to the assembled product manufacturer.

The examined power mode transition information 44 includes information on power modes examined in the semiconductor device manufacturer and information on a transition among the power modes. The power control register information 51 is information on a predetermined register in the semiconductor integrated circuit 21 used in partial power control. The power control program (PCP) is a partial power control program created by the user as the assembled product manufacturer.

As a result of the power mode transition check process in step S21, the power control program (PCP) checks whether only the examined power modes are used and whether only examined power mode transitions are used and, if an unexamined power mode and, additionally, an unexamined power mode transition are used, outputs a check result to that effect. The check result is outputted to inform the user. For example, information on an unexamined power mode and an unexamined power mode transition is stored in, e.g., a predetermined area of the storage device 14 and is displayed on a screen of the monitor 15.

Figure 7:
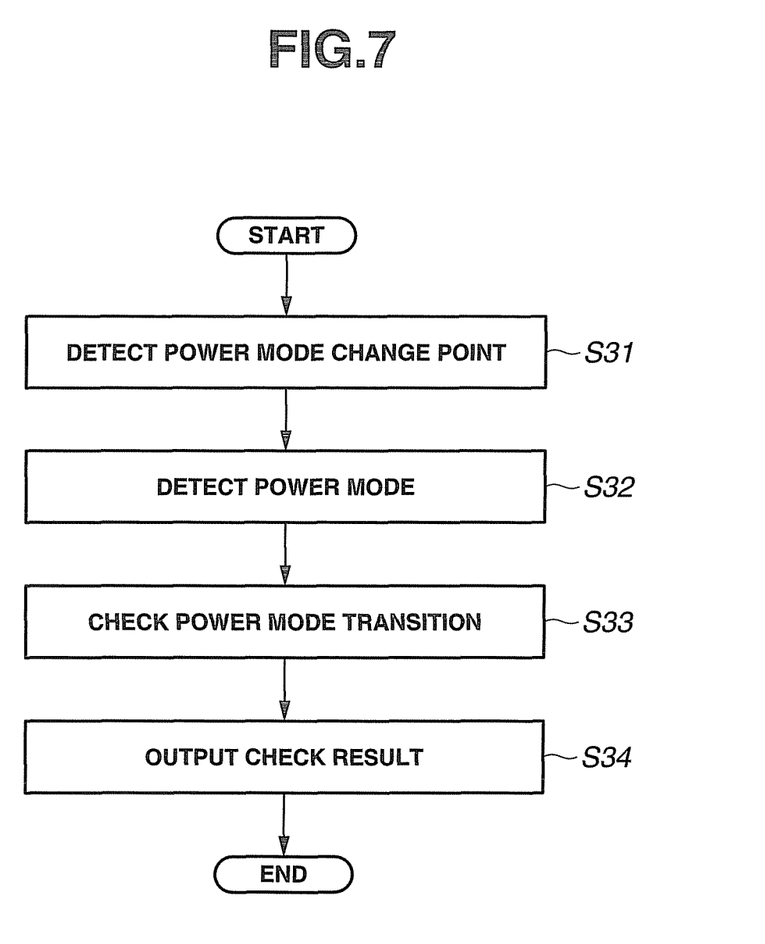
FIG. 7 is a flow chart showing an example of details of a power mode transition check program (PTCP) according to the first embodiment of the present invention.

Details of processing of the power mode transition check program (PTCP) in step S21 will be described. FIG. 7 is a flow chart showing an example of the details of the processing of the power mode transition check program (PTCP).

First, a power mode change point is detected in the power control program (PCP) (step S31). The power mode transition check program (PTCP) extracts the isolation signals Ii in order of execution from the power control program (PCP) and detects a power mode change point (step S31).

After the power mode change point is detected, a power mode is detected (step S32). As described above, the power mode detection is performed by detecting values of all the power control signals Pi at a change point after the power mode change point in the case of power-off and detecting values of all the power control signals Pi at a time point at the power mode change point in the case of a return from power-off.

A power mode transition is checked (step S33). The power mode transition is determined by order of detected power modes, and the power mode transition is checked by a comparison with the examined power mode transition information 44. In the power mode transition check, not only whether examined power modes are performed but also whether the power mode transition is an examined power mode transition is checked.

As described above, the power mode transition check program (PTCP) serving as the power mode check section detects a power mode on the basis of the isolation signals and the power control signals to each of the power domains at the time of execution of partial power control and compares each detected power mode with examined power modes recorded, thereby checking whether the examined power modes are used.

Finally, a check result is outputted (step S34). The output includes, for example, writing of the check result into a predetermined storage area of the storage device 14 and display of the check result on the monitor 15. Although the check result includes information on an unexamined power mode (i.e., a power mode other than the examined power modes) and information on a transition associated with the unexamined power mode, the check result may include information on the examined power modes and information on a transition among the power modes.

As described above, the power mode transition check program (PTCP) serving as the power mode check section checks whether examined power modes recorded by the power mode detection section at the time of execution of partial power control are used and outputs a check result.

Figure 8:
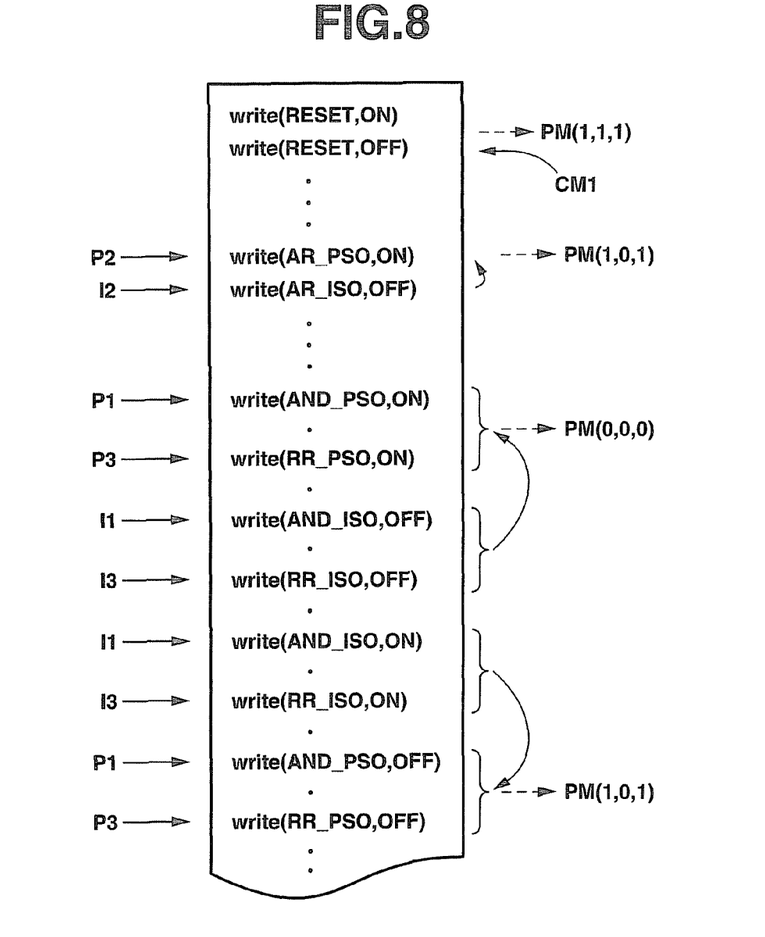
FIG. 8 is a chart for explaining an example of a power control program (PCP) according to the first embodiment of the present invention.

FIG. 8 is a chart for explaining an example of the power control program (PCP). As shown in FIG. 8, an instruction to write predetermined data into a predetermined register for power control is included in the power control program (PCP). FIG. 8 shows an example of the program when power control shown in FIGS. 5A to 5H is performed. Operation of the power mode transition check program (PTCP) serving as the power mode check section will be described with reference to FIG. 8.

After a reset command CM1, detection of the isolation signals Ii is performed. The power control program (PCP) performs isolation control and power control on the basis of the power control register information. Accordingly, the power mode transition check program (PTCP) extracts WRITE instructions to registers.

An isolation control instruction is (a set of isolation control instructions are) detected as a power mode change point, details of a power control instruction between power mode change points are interpreted, and a status of a power mode is calculated. In the case of power-off, a power mode is calculated and recorded on the basis of a power control instruction between a power mode change point and a change point after the power mode change point. On the other hand, in the case of a return from power-off, a power mode is calculated and recorded on the basis of a power control instruction between a power mode change point and a change point before the power mode change point.

Referring to FIG. 8, a power mode is determined to be PM(1,0,1) on the basis of a WRITE instruction (write(AR_PSO,ON)) corresponding to the power control signal P2 before the change point in response to a WRITE instruction (write(AR_ISO,OFF)) corresponding to the isolation signal I2. After that, a power mode is determined to be PM(0,0,0) on the basis of WRITE instructions (write(AND_PSO,ON) and write(RR_PSO,ON)) corresponding to the power control signals P1 and P3 before the change point for the isolation signals I1 and I3 in response to WRITE instructions (write(AND_ISO,OFF) and write(RR_ISO,OFF)) corresponding to the isolation signals I1 and I3. After that, a power mode is determined to be PM(1,0,1) on the basis of WRITE instructions (write(AND_PSO,OFF) and write(RR_PSO,OFF)) corresponding to the power control signals P1 and P3 after the change point for the isolation signals I1 and I3 in response to WRITE instructions (write(AND_ISO,ON) and write(RR_ISO,ON)) corresponding to the isolation signals I1 and I3.

Figure 9:
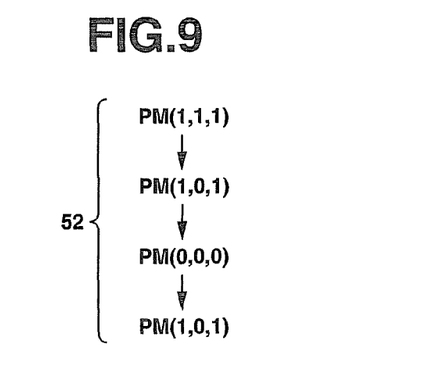
FIG. 9 is a chart for explaining an example of a check result according to the first embodiment of the present invention.

FIG. 9 is a chart for explaining an example of the check result in step S34. Information on determined power modes is outputted as power mode information as shown in FIG. 9.

As described above, it is possible to extract a transition between each two power modes and a power mode transition with up to n (a user-defined number) stages, make a comparison with information recorded in the examined power mode transition information 44, and check whether the transitions and the power modes are examined, with regard to determined and detected power modes. If a transition in the power control software (PCP) is not found in the examined power mode transition information 44, a notification is made or an output is produced to the effect that an unexamined power mode transition is used.

Accordingly, according to the semiconductor integrated circuit design support system 1 described above, it is checked on the basis of the examined power mode transition information generated by the power mode transition detection program (PTDP) whether only an examined power mode is used in the power control program (PCP) and whether only an examined power mode transition is used are checked. If an unexamined power mode or an unexamined power mode transition is used, a check result is outputted to that effect.

As a result, the check result is carefully inspected in the user as the assembled product manufacturer. If modification of the power control program (PCP) is necessary, the software program is modified. If there is an imperfection in power control specifications, the power control specifications are modified. An LSI manufacturer is notified of the changes. Alternatively, an unexamined power mode and an unexamined power mode transition may be examined in the semiconductor device manufacturer. If hardware as a semiconductor integrated circuit and software as a power control program are separately developed in the above-described manner, it is possible to resolve an incompatibility as described above and prevent, in advance, an unexamined power mode from being used.

Second Embodiment

A second embodiment of the present invention will be described. The first embodiment described above is directed to a system for resolving an incompatibility between specifications for partial power control and a power control program if a semiconductor integrated circuit having a partial power control mechanism and a power control program are separately developed. The second embodiment assumes that development of a semiconductor integrated circuit and development of a power control program are performed in concert with each other, a semiconductor chip with a semiconductor integrated circuit has been finished, e.g., to some degree, and an unexamined power mode is run. The second embodiment is intended to generate an interrupt signal to a CPU in the semiconductor integrated circuit, resolve an incompatibility between specifications for partial power control and the power control program, and prevent an unexamined power mode from being run and an unexamined power mode transition from being performed in the case. Examples of the case include an environment in which development of hardware as a semiconductor integrated circuit and development of software as a power control program are performed by a simulator in concert with each other, a software development environment which uses rapid prototyping using an FPGA or an emulator, and a software development environment which uses a real chip after completion of hardware design.

A power mode transition detection section in the present embodiment is the same as the power mode transition detection section in the first embodiment, and a description of the power mode transition detection section will be omitted.

Figure 10:
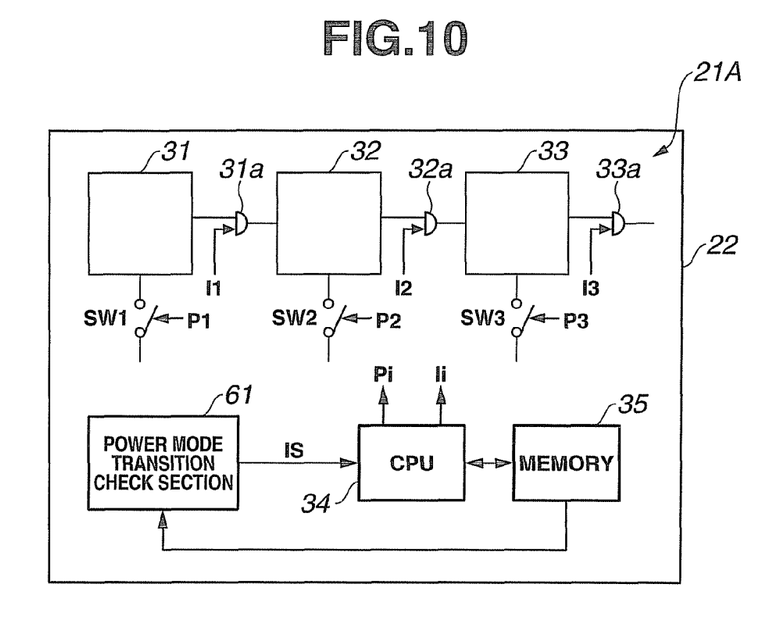
FIG. 10 is a block diagram showing a configuration of a semiconductor integrated circuit according to a second embodiment of the present invention.

FIG. 10 is a block diagram showing a configuration of a semiconductor integrated circuit according to the second embodiment. Note that the same components as the components in the first embodiment are denoted by the same reference numerals, and a description of the components will be omitted.

As shown in FIG. 10, a power mode transition check section 61 is provided in a semiconductor integrated circuit 21A using an assertion description or a logic circuit. Of functions of the power mode transition check section 61, a function of detecting a power mode change point (step S31), a function of detecting a power mode (step S32), and a function of recording a power mode transition (step S33) are the same as the processes described with reference to FIG. 4. A power control program (PCP) and examined power mode transition information 44 are stored in a memory 35. That is, the memory 35 constitutes a storage section capable of storing power mode information on examined power modes in the semiconductor integrated circuit 21A.

Figure 11:
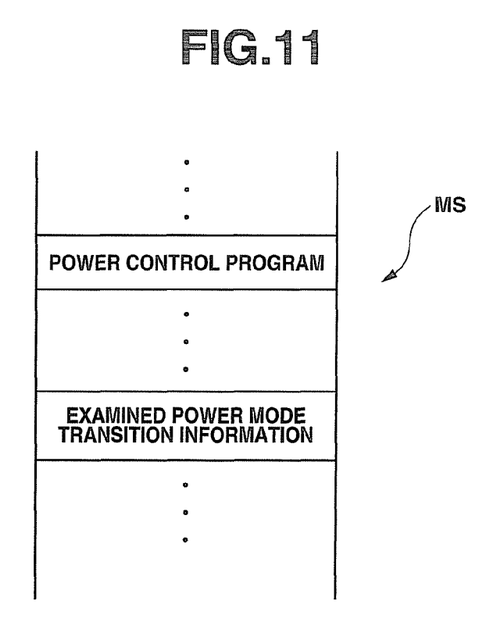
FIG. 11 is a chart showing how a power control program (PCP) executed on a CPU in the semiconductor integrated circuit and examined power mode transition information are arranged in a memory space MS, according to the second embodiment of the present invention.

FIG. 11 is a chart showing how the power control program (PCP) executed on a CPU 34 on the semiconductor integrated circuit 21A having a partial power control mechanism and the examined power mode transition information 44 are arranged in a memory space MS. The CPU 34 is capable of executing the power control program (PCP). The power mode transition check section 61 monitors execution of the power control program (PCP) while referring to the examined power mode transition information 44.

More specifically, the power mode transition check section 61 monitors all isolation signals during execution of partial power control and detects, as a power mode change point, a time point when any of the isolation signals changes. Like the power mode transition check program (PTCP) according to the first embodiment, the power mode transition check section 61 detects a change point for all power control signals after the power mode change point and stores, as a power mode, values of all the power control signals after a power control signal change in a predetermined memory area or a predetermined register, in the case of power-off. The power mode transition check section 61 also stores, in the same manner, values of all the power control signals at a time point at the power mode change point as a power mode in the case of a return from power-off.

The power mode transition check section 61 compares a transition between each two power modes and a power mode transition with up to n (a user-defined number) stages with the examined power mode transition information 44 on the basis of a memory of detected power modes and checks whether each stored power mode matches the examined power mode transition information 44.

If each detected power mode transition is not included in the examined power mode transition information 44, the power mode transition check section 61 generates and outputs an interrupt signal IS to the CPU or the like in the semiconductor integrated circuit 21A.

As described above, the power mode transition check section 61 serving as the power mode check section checks whether any examined power mode stored at the time of execution of partial power control is used and whether each power mode transition is an examined power mode transition. If a checked power mode other than the examined power modes is run or a checked power mode transition other than the examined power mode transitions is performed, the power mode transition check section 61 outputs a predetermined interrupt signal to the CPU 34 of the semiconductor integrated circuit 21A.

Accordingly, information of an outputted interrupt signal IS can be obtained. At a stage when modification of hardware of the semiconductor integrated circuit is still possible, a designer of the semiconductor integrated circuit adds a test environment for verifying validity of power specifications, a test environment for generating an unexamined power mode detected, and the like to a test pattern 42 and performs additional verification.

At a stage when modification of hardware of the semiconductor integrated circuit 21A is impossible, modification of software, such as watching for the interrupt signal IS indicating detection of an unexamined power mode by the software and, if the interrupt signal IS is generated, preventing a change to the unexamined power mode, or addition of a countermeasure program is performed.

As described above, according to the present embodiment, it is possible to detect a change to an unexamined power mode in a semiconductor integrated circuit and take measures using software in order to prevent a change to an unexamined power mode.

Third Embodiment

A third embodiment of the present invention will be described. The above-described second embodiment is designed to resolve an incompatibility between specifications for partial power control and a power control program by generating an interrupt signal to a CPU in a semiconductor integrated circuit if development of the semiconductor integrated circuit and development of the power control program are performed in concert with each other, and an unexamined power mode is run. In contrast, the present embodiment is intended to, if a semiconductor chip equipped with a semiconductor integrated circuit having a partial power control mechanism is mounted on a product, and the product is shipped to market, resolve an incompatibility between specifications for partial power control and a power control program and prevent an unexamined power mode from being run and an unexamined power mode transition from being performed.

Figure 12:
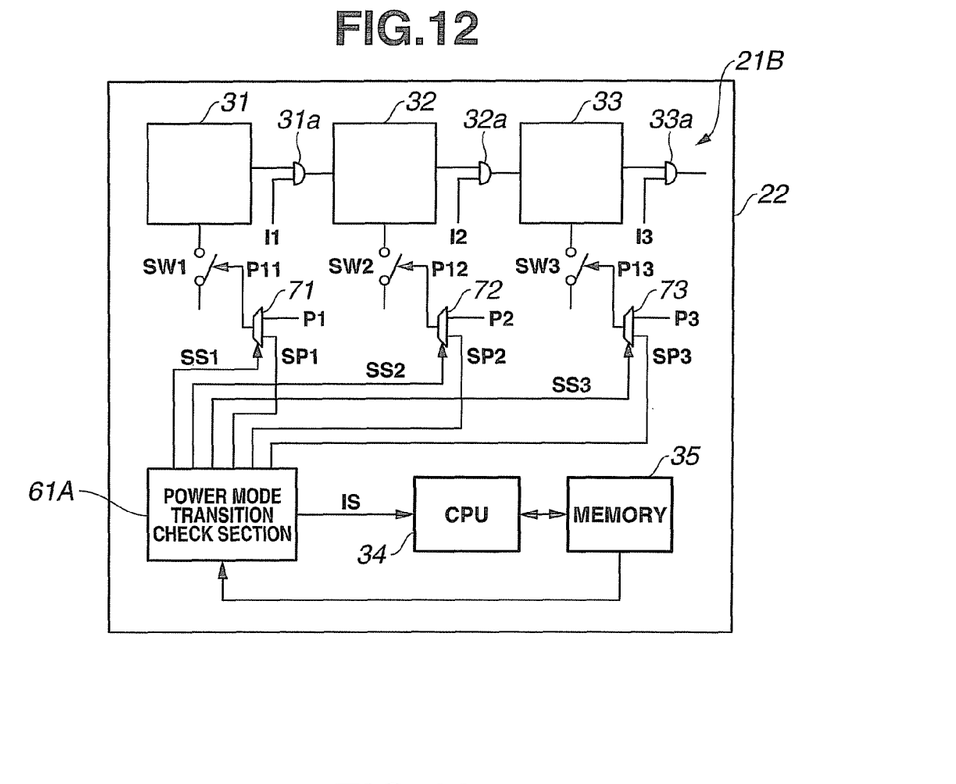
FIG. 12 is a block diagram showing a configuration of a semiconductor integrated circuit according to a third embodiment of the present invention.

FIG. 12 is a block diagram showing a configuration of a semiconductor integrated circuit according to the third embodiment. Note that the same components as the components in the first and second embodiments are denoted by the same reference numerals, and a description of the components will be omitted.

A power mode transition detection section according to the present embodiment is the same as the power mode transition detection section in the first embodiment, and a description of the power mode transition detection section will be omitted.

As shown in FIG. 12, a power mode transition check section 61A is provided in a semiconductor integrated circuit 21B using an assertion description or a logic circuit. Of functions of the power mode transition check section 61A, a function of detecting a power mode change point (step S31), a function of detecting a power mode (step S32), and a function of recording a power mode transition (step S33) are the same as the processes described with reference to FIG. 4. A power control program (PCP) and examined power mode transition information 44 are stored in a memory 35. That is, the memory 35 constitutes a storage section capable of storing power mode information on examined power modes in the semiconductor integrated circuit 21B.

As shown in FIG. 12, the power mode transition check section 61A outputs a selection signal and a power control signal to a selector provided for each power domain. More specifically, the power mode transition check section 61A outputs a selection signal SS1 and a power control signal SP1 to a selector 71 provided to correspond to a power domain 31. Similarly, the power mode transition check section 61A outputs selection signals SS2 and SS3 and power control signals SP2 and SP3 to selectors 72 and 73 provided to respectively correspond to power domains 32 and 33.

Each selector selects a power control signal Pi from a CPU 34 or the power control signal SPi from the power mode transition check section 61A in response to the selection signal and outputs a power control signal P1i for controlling supply of power to the power domain. In other words, although a power control signal for controlling supply of power to each power domain is directly supplied from the CPU 34 to the switch SWi in the first and second embodiments, a power control signal selected by each selector is supplied to a switch SWi in the present embodiment.

In the present embodiment, the power mode transition check section 61A monitors execution of the power control program (PCP) to be executed in the semiconductor integrated circuit 21B, dynamically observes a power mode changed by the power control program (PCP), and compares a power mode to be replaced with the examined power mode transition information 44. If it is detected that the power mode to be replaced is an unexamined power mode or that a power mode transition is an unexamined power mode transition, the power mode transition check section 61A generates and outputs the power control signal SPi for preventing a power domain to be powered off from being turned off and outputs the selection signal SSi to the corresponding selector to select the power control signal SPi.

The power mode transition check section 61A can prevent a change to an unexamined power mode and an unexamined power mode transition from occurring by preventing the corresponding power domain from being turned off.

As described above, the power mode transition check section 61A serving as a power mode check section checks whether an examined power mode stored at the time of execution of partial power control is used and whether an examined power mode transition is used. If a power mode other than examined power modes checked is run or if an unexamined power mode transition is performed, one of the examined power modes is run instead of the power mode other than the examined power modes. It is thus possible to prevent a change to an unexamined power mode and an unexamined power mode transition from occurring.

Note that not only prevention of a change to a power mode but also the following method may be adopted. Specifically, the power mode transition check section 61A may check a power mode to be replaced against the examined power mode transition information and retrieves an examined power mode which requires a smallest number of changes. The power mode transition check section 61A may generate the power control signals SPi and the selection signals SSi to obtain the retrieved power mode and may forcibly replace the power mode to be replaced with the retrieved power mode.

For example, if power modes of PM(1,0,0), PM(0,0,0), and PM(1,1,1) are examined, an attempt to change the current power mode to PM(1,1,0) is detected, the current power mode can be changed to any one of the examined power modes of PM(1,0,0), PM(0,0,0), and PM(1,1,1).

However, in the case, one of the examined power modes which requires a smallest number of power domains to be powered on compared with PM(1,1,0) is selected. Conversely, a power mode with a larger number of power domains which are off is selected. That is, the power mode transition check section 61A checks PM(1,1,0) against the examined power mode transition information and determines that P(1, 0,0) requires a smallest number of power domains to be powered on (i.e., to be set to 0) upon a change from PM(1,1, 0), in the above-described case. As a result, PM(1,0,0) is selected. As described above, the power mode transition check section 61A performs the power mode selection process.

Note that although the power mode transition check section 61A controls the selectors such that outputs from the CPU 34 are not supplied to the switches in FIG. 12, the power mode transition check section may receive power control signals from the CPU 34 and supply the power control signals P1i to the switches on the basis of the inputs.

Figure 13:
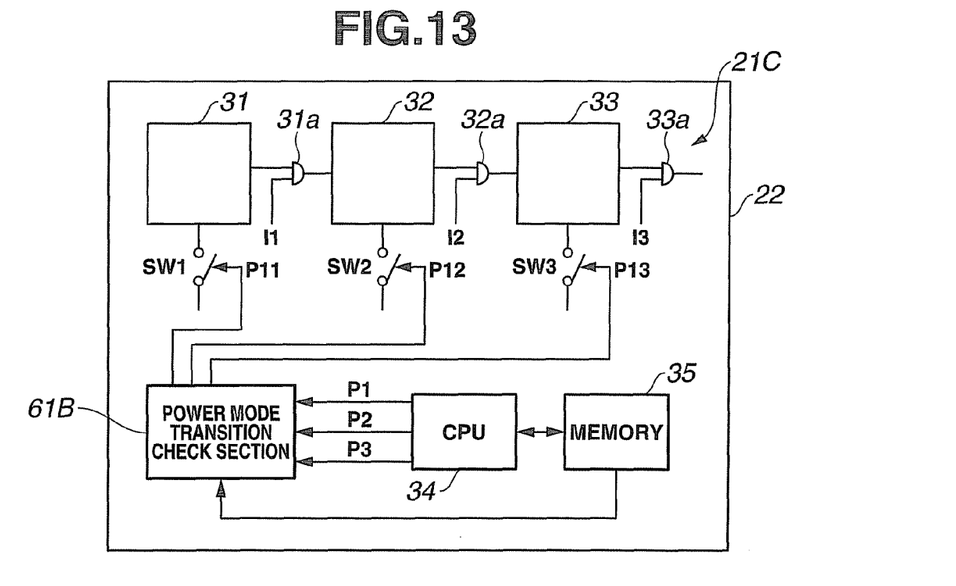
FIG. 13 is a block diagram showing a configuration of a semiconductor integrated circuit according to a modification of the third embodiment of the present invention.

FIG. 13 is a block diagram showing a configuration of a semiconductor integrated circuit according to a modification of the present embodiment in FIG. 12. Referring to FIG. 13, a power mode transition check section 61B receives the power control signal Pi from the CPU 34 and prevents a change to an unexamined power mode in the same manner as in FIG. 12.

As described above, according to the present embodiment, since a semiconductor integrated circuit detects a change to an unexamined power mode and forcibly replaces the unexamined power mode with an examined power mode, it is possible to suppress generation of a problem due to insufficient verification.

As has been described above, according to the above-described embodiments, it is possible to, in a semiconductor integrated circuit for performing partial power control by software using an embedded microprocessor, realize a semiconductor integrated circuit design support system or a semiconductor integrated circuit for allowing suppression of generation of a problem due to insufficient verification.

Each "section" in the present specification corresponds to a function of the embodiments and is conceptual, and does not necessarily correspond one-to-one to specific hardware or a specific software routine. Accordingly, in the present specification, each embodiment has been described with virtual circuit blocks (sections) each having a function of the embodiment in mind. Order of execution of steps of procedures in each embodiment may be changed, some of the steps may be simultaneously performed, or the steps may be performed in a different order for each execution, unless such execution operations are inconsistent with nature of the steps.

Note that all or some of program codes of a program configured to perform the above-described operations are recorded or stored as a computer program product in a portable medium such as a flexible disk or a CD-ROM or a storage medium such as a hard disk. The program is read by a computer, and all or some of the operations are performed. Alternatively, all or some of the program codes can be distributed or provided through a communication network. A user can download the program through the communication network and install the program in the computer or can install the program from a recording medium into the computer, thereby easily realizing a semiconductor integrated circuit design support system according to the present invention.

The present invention is not limited to the above-described embodiments, and various changes, modifications, and the like can be made without departing from scope of the present invention.

What is claimed is:

1. A semiconductor integrated circuit design support system having a partial power control mechanism, comprising:
   a partial power control simulation section configured to perform a partial power control simulation on the basis of a circuit description of the semiconductor integrated circuit and a power specifications description;
   a power mode detection section configured to detect a power mode which is run during execution of the partial power control simulation and record a plurality of pieces of power mode information in transitions of the power mode as power mode information of an examined power mode, the power mode being defined by a state of a plurality of power control signals for a plurality of power domains which are allowed to be powered off in the semiconductor integrated circuit, and the plurality of pieces of the power mode information including information on the state of the plurality of power control signals in the transitions of the power mode; and
   a power mode check section configured to check whether the examined power mode recorded by the power mode detection section is used at the time of execution of partial power control by the semiconductor integrated circuit according to a partial power control program and output a check result thereof, by comparing information of a power mode detected at the time of execution of the partial power control with the power mode information of the examined power mode.

2. The semiconductor integrated circuit design support system according to claim 1, wherein
   the power mode information includes information on an examined power mode transition during execution of the partial power control simulation, and
   the power mode check section also checks whether a power mode transition at the time of execution of the partial power control is the examined power mode transition recorded by the power mode detection section.

3. The semiconductor integrated circuit design support system according to claim 1, wherein
   the power mode detection section detects the power mode on the basis of an isolation signal and a power control signal to each of power domains during execution of the partial power control simulation.

4. The semiconductor integrated circuit design support system according to claim 1, wherein
   the power mode detection section detects the power mode on the basis of an isolation signal and the power control signal to each of power domains at the time of execution of the partial power control.

5. The semiconductor integrated circuit design support system according to claim 1, wherein
   the power mode check section is composed of a software program.

6. The semiconductor integrated circuit design support system according to claim 1, wherein
   the check result includes one of information on the examined power mode recorded and information on a power mode other than the examined power mode.

7. A semiconductor integrated circuit having a partial power control mechanism, comprising:
   a storage section capable of storing a plurality of pieces of power mode information of an examined power mode in the semiconductor integrated circuit, the examined power mode being defined by a state of a plurality of power control signals for a plurality of power domains which are allowed to be powered off in the semiconductor integrated circuit, and the plurality of pieces of the power mode information including information on the state of the plurality of power control signals in transitions of the power mode; and
   a power mode check section configured to check whether the examined power mode stored is used at the time of execution of partial power control and, if a power mode other than the examined power mode checked is run, output a predetermined interrupt signal to a CPU of the semiconductor integrated circuit.

8. The semiconductor integrated circuit according to claim 7, wherein
   the power mode information includes information on an examined power mode transition, and
   the power mode check section also checks whether a power mode transition at the time of execution of the partial power control is the examined power mode transition stored.

9. The semiconductor integrated circuit according to claim 7, wherein
   the power mode check section detects the power mode on the basis of an isolation signal and the power control signal to each of power domains at the time of execution of the partial power control and checks whether the examined power mode is used by comparing the power mode detected with the examined power mode recorded.

10. The semiconductor integrated circuit according to claim 7, wherein
    the power mode check section is composed of one of an assertion description and a logic circuit.

11. A semiconductor integrated circuit having a partial power control mechanism, comprising:
    a storage section capable of storing a plurality of pieces of power mode information of an examined power mode in the semiconductor integrated circuit, the examined power mode being defined by a state of a plurality of power control signals for a plurality of power domains which are allowed to be powered off in the semiconductor integrated circuit, and the plurality of pieces of the power mode information including information on the state of the plurality of power control signals in transitions of the power mode; and
    a power mode check section configured to check whether the examined power mode stored is used at the time of execution of partial power control and, when a power mode other than the examined power mode checked is run, replace the power mode other than the examined power mode with the examined power mode and run the examined power mode.

12. The semiconductor integrated circuit according to claim 11, wherein
the power mode information includes information on an examined power mode transition, and
the power mode check section also checks whether a power mode transition at the time of execution of the partial power control is the examined power mode transition stored.

13. The semiconductor integrated circuit according to claim 11, wherein
the power mode check section detects the power mode on the basis of an isolation signal and the power control signal to each of power domains at the time of execution of the partial power control and checks whether the examined power mode is used by comparing the power mode detected with the examined power mode recorded.

14. The semiconductor integrated circuit according to claim 11, wherein
if a power mode other than the examined power mode is replaced with the examined power mode, the power mode check section selects one of the examined power modes which requires a smallest number of power domains to be powered on.

15. The semiconductor integrated circuit of claim 11, wherein
the power mode check section replaces the power mode other than the examined power mode with the examined power mode so that a power domain that is to be powered off by the partial power control is not turned off when the power mode other than the examined power mode checked is run.

16. A design support method for a semiconductor integrated circuit having a partial power control mechanism, comprising:
performing a partial power control simulation on the basis of a circuit description of the semiconductor integrated circuit and a power specifications description;
detecting a power mode which is run during execution of the partial power control simulation and recording a plurality of pieces of power mode information in transitions of the power mode as power mode information of an examined power mode, the power mode being defined by a state of a plurality of power control signals for a plurality of power domains which are allowed to be powered off in the semiconductor integrated circuit, and the plurality of pieces of the power mode information including information on the state of the plurality of power control signals in the transitions of the power mode; and
checking whether the examined power mode recorded is used at the time of execution of partial power control by the semiconductor integrated circuit according to a partial power control program and outputting a check result thereof, by comparing information of a power mode detected at the time of execution of the partial power control with the power mode information of the examined power mode.

17. The design support method for the semiconductor integrated circuit according to claim 16, wherein
the power mode information includes information on an examined power mode transition during execution of the partial power control simulation, and
the checking of the power mode also includes checking whether a power mode transition at the time of execution of the partial power control is the examined power mode transition recorded.

18. The design support method for the semiconductor integrated circuit according to claim 16, wherein
the detecting of the power mode is performed on the basis of an isolation signal and a power control signal to each of power domains during execution of the partial power control simulation.

19. The design support method for the semiconductor integrated circuit according to claim 16, wherein
the checking of the power mode includes detecting the power mode on the basis of an isolation signal and the power control signal to each of power domains at the time of execution of the partial power control and checking whether the examined power mode is used by comparing the power mode detected with the examined power mode recorded.

20. The design support method for the semiconductor integrated circuit according to claim 16, wherein
the check result includes one of information on the examined power mode recorded and information on a power mode other than the examined power mode.

* * * * *